(12) United States Patent
Robb

(10) Patent No.: US 6,841,437 B1
(45) Date of Patent: Jan. 11, 2005

(54) METHOD OF FORMING A VERTICAL POWER SEMICONDUCTOR DEVICE AND STRUCTURE THEREFOR

(75) Inventor: Stephen P. Robb, Fountain Hills, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 0 days.

(21) Appl. No.: 10/464,971

(22) Filed: Jun. 20, 2003

(51) Int. Cl.[7] .................... H01L 21/8238; H01L 21/336

(52) U.S. Cl. .................... 438/209; 438/206; 438/208; 438/268

(58) Field of Search .................. 438/209, 206, 438/208, 268

(56) References Cited

U.S. PATENT DOCUMENTS

| 4,110,782 | A | * | 8/1978 | Nelson et al. | 257/502 |
|---|---|---|---|---|---|
| 4,795,716 | A | * | 1/1989 | Yilmaz et al. | 438/209 |
| 4,881,112 | A | * | 11/1989 | Matsushita | 257/338 |
| 4,896,199 | A | * | 1/1990 | Tsuzuki et al. | 257/49 |
| 5,171,699 | A | * | 12/1992 | Hutter et al. | 438/206 |
| 5,317,180 | A | * | 5/1994 | Hutter et al. | 257/337 |
| 6,781,804 | B1 | * | 8/2004 | Claverie | 361/56 |

* cited by examiner

Primary Examiner—John F. Niebling
Assistant Examiner—Ron Pompey
(74) Attorney, Agent, or Firm—Robert F. Hightower

(57) ABSTRACT

A method of forming medium breakdown voltage vertical transistors (11) and lateral transistors (12, 13) on the same substrate (14) provides for optimizing the epitaxial layer (16) for the lateral transistors (12, 13). The vertical transistor (11) is formed in a well (18) that has a lower resistivity than the epitaxial layer (16) to provide the required low on-resistance for the vertical power transistor (11).

12 Claims, 4 Drawing Sheets

US 6,841,437 B1

METHOD OF FORMING A VERTICAL POWER SEMICONDUCTOR DEVICE AND STRUCTURE THEREFOR

BACKGROUND OF THE INVENTION

The present invention relates, in general, to electronics, and more particularly, to methods of forming semiconductor devices and structure.

In the past, the semiconductor industry utilized various structures and methods to form vertical power transistors on the same substrate with lateral low breakdown voltage transistors. Forming both a vertical power transistor and a lateral transistor on the same semiconductor die was highly desirable and offered designers the flexibility to combine various functions on a single semiconductor die. The vertical power transistor usually had a higher breakdown voltage than the lateral transistors. In order to obtain the higher breakdown voltage, the vertical transistor was formed in a thick epitaxial layer that had a high resistivity. One accepted figure of merit for the resulting on-resistance of the vertical transistor was the on-resistance area product. The vertical transistors typically had an on-resistance area product that was no less than one (1.0) milli-ohm-cm$^2$. The lateral transistor had to be formed in a well in the epitaxial layer. The large thickness of the epitaxial layer provided sufficient depth to form the high resistivity well for the lateral transistor within the epitaxial layer.

In some applications it would have been advantageous to build medium or low breakdown voltage vertical power transistors on the same die with lateral transistors. Medium and low breakdown voltage vertical power transistors generally had a breakdown voltage no greater than about forty volts (40 V). However, medium and low breakdown voltage vertical transistors used a thinner epitaxial layer than the high breakdown voltage vertical transistors. A thinner epitaxial layer generally did not allow sufficient room to form the well in which the lateral devices were built. Consequently, it was difficult to combine any lateral transistors on the same semiconductor die with medium or low breakdown voltage vertical power devices. Accordingly, it is desirable to have a method of forming a medium or low breakdown vertical power transistor and lateral transistors on the same semiconductor die.

BRIEF DESCRIPTION OF THE DRAWINGS

For simplicity and clarity of illustration, elements in the figures are not necessarily to scale, and the same reference numbers in different figures denote the same elements. Additionally, descriptions and details of well known steps and elements are omitted for simplicity of the description.

DETAILED DESCRIPTION OF THE DRAWINGS

Figure 1:
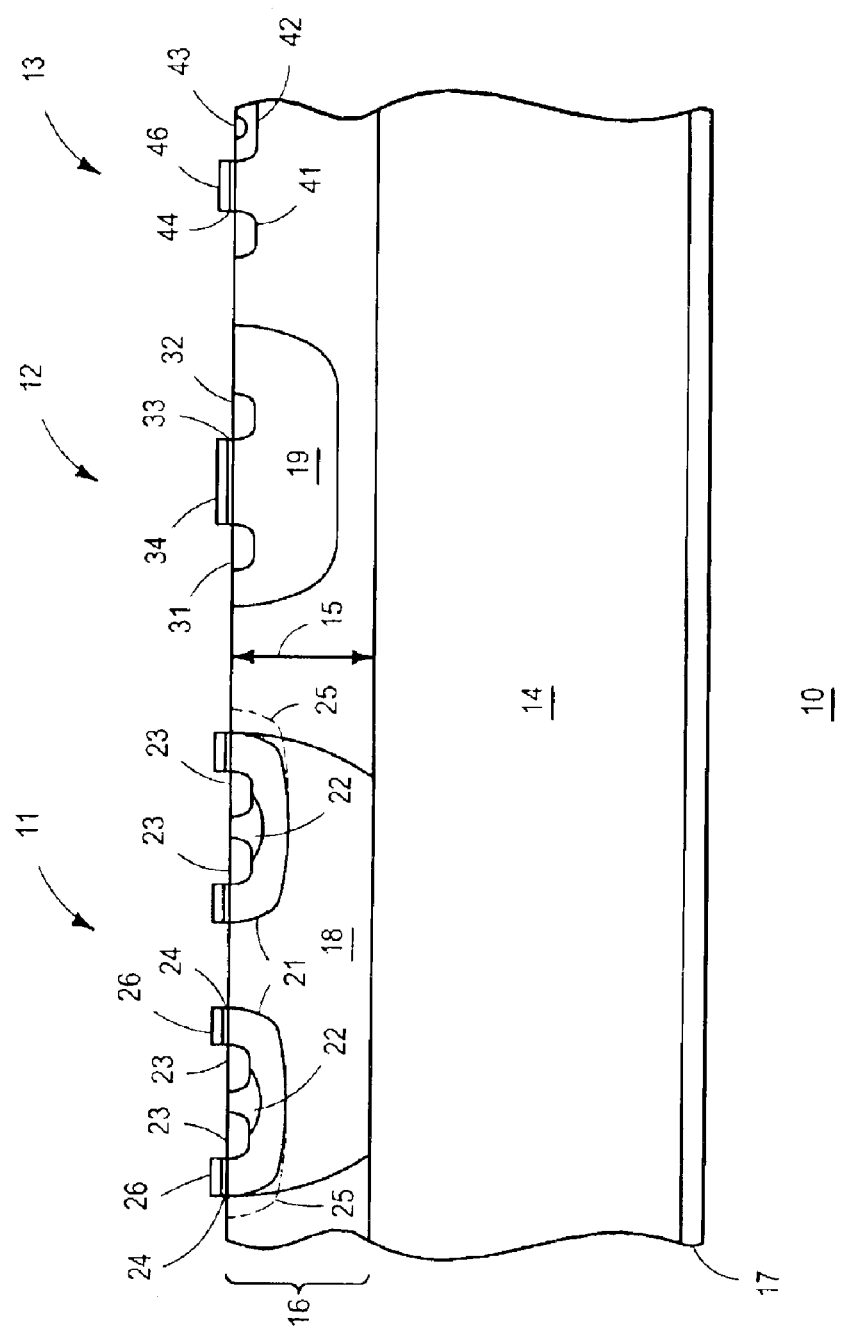
FIG. 1 schematically illustrates a cross-sectional portion of an embodiment of semiconductor device in accordance with the present invention.

FIG. 1 schematically illustrates a cross-sectional portion of a semiconductor device 10 that includes a lateral transistor 12, another lateral transistor 13, and a high current vertical power transistor 11 that has a low on-resistance. Transistor 11 typically has a medium breakdown voltage but may also have a low breakdown voltage. Transistor 11 typically has an on-resistance area product that is no greater than about 0.7 milli-ohm-cm$^2$. The method of forming transistors 11, 12, and 13 facilitates forming various types of lateral transistors, other active elements, and passive elements on the same semiconductor die with vertical power transistor 11. Transistors 11, 12, and 13 are identified in a generally way by arrows. In the preferred embodiment, transistors 11 and 12 are N-channel transistors and transistor 13 is a P-channel transistor. However, a person of ordinary skill in the art will appreciate that it is possible to form transistors 11 and 12 as P-channel devices and transistor 13 as an N-channel device.

Semiconductor device 10 includes a substrate 14 that has an epitaxial layer 16 formed on a surface of substrate 14. Layer 16 typically is formed as an epitaxial layer that has a lower doping concentration and higher resistivity than substrate 14. Layer 16 is formed to have a thickness 15 and a resistivity that are suitable for forming lateral transistors 12 and 13. The resistivity of layer 16 generally is much higher than the resistivity needed to form a low on-resistance vertical power transistor. Thickness 15 generally is no greater than five (5) microns and the resistivity of layer 16 usually is no greater than about 0.8 ohm-centimeter. In the preferred embodiment, layer 16 is N-type semiconductor material that has a resistivity between about 0.6 and 0.8 ohm-centimeter and has a thickness that is no greater than about four to five microns. Such a resistivity and thickness of layer 16 facilitates forming transistors 12 and 13 in layer 16. Previously, such a resistivity and thickness were not suitable for forming a low on-resistance high current vertical power transistor. Substrate 14 preferably has a resistivity that is no greater than approximately 0.005 ohm-centimeter.

As will be seen in more detail hereinafter, the method of forming device 10 also facilitates forming transistor 11 within a first doped region or first well 18 that is formed in layer 16. Well 18 is formed to have a conductivity type that is the same as the conductivity type of substrate 14 and a resistivity that is less than the resistivity of layer 16 an d that is greater than the resistivity of substrate 14. Lateral transistor 12 is formed to include a source region 31 and a drain region 32 that are formed in a second doped region or second well 19. A gate insulator 33 and a gate conductor 34 of transistor 12 are formed on the surface of layer 16 and interposed between regions 31 and 32. Lateral transistor 13 is formed to include a high voltage drain region 42, a drain 43 formed within region 42, and a source region 41. A gate insulator 44 and a gate conductor 46 of transistor 13 are formed on the surface of layer 16 and interposed between regions 41 and 42. Vertical power transistor 11 is formed to also include a plurality of third wells or drift regions 21 that each have a fourth well or body region 22 formed therein. A plurality of source regions 23 are formed in drift regions 21 and intersect body regions 22. A gate insulator 24 and gate conductor 26 are formed on the surface of layer 16 adjacent to each source region 23. It should be noted that regions 21 could also be formed as one continuous region such as stripes that all converge at one end into one common doped region. Insulator 24 and conductor 26 are a portion of a gate structure that is overlying a portion of region 21 and adjacent to one of the plurality of gate structures. As is well known in the art that the number of regions 21 and 23 affect the current capacity of transistor 11, and also that transistor 11 could be formed with a single drift region 21 and source region 23. A drain contact 17 is formed on a surface of substrate 14 opposite to layer 16.

In the preferred embodiment, transistor 11 is a vertical N-channel power field effect transistor having a breakdown voltage of about fifteen volts (15 V) to forty volts (40 V), and an on-resistance area product that is about 0.5 milli-ohm-cm$^2$. In this preferred embodiment, substrate 14, layer 16, well 18, and regions 23 are N-type semiconductor material while regions 21 and 22 are doped P-type. Also, transistor 12 is an N-channel lateral transistor thus well 19 is doped P-type and regions 31 and 32 are N-type. Transistor 13 is a P-channel lateral transistor thus drain 43 and regions 41 and 42 are doped P-type.

Figure 2:
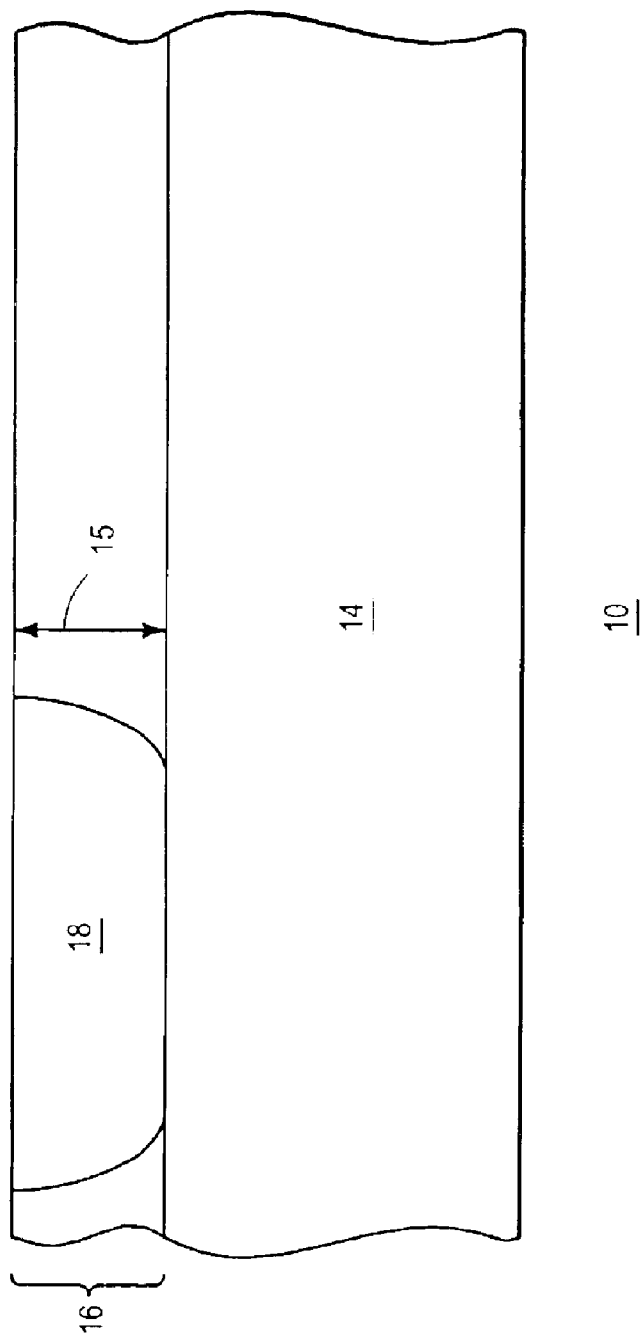
FIG. 2 schematically illustrates an embodiment of a portion of the semiconductor device of FIG. 1 at a stage of manufacturing in accordance with the present invention.
Figure 3:
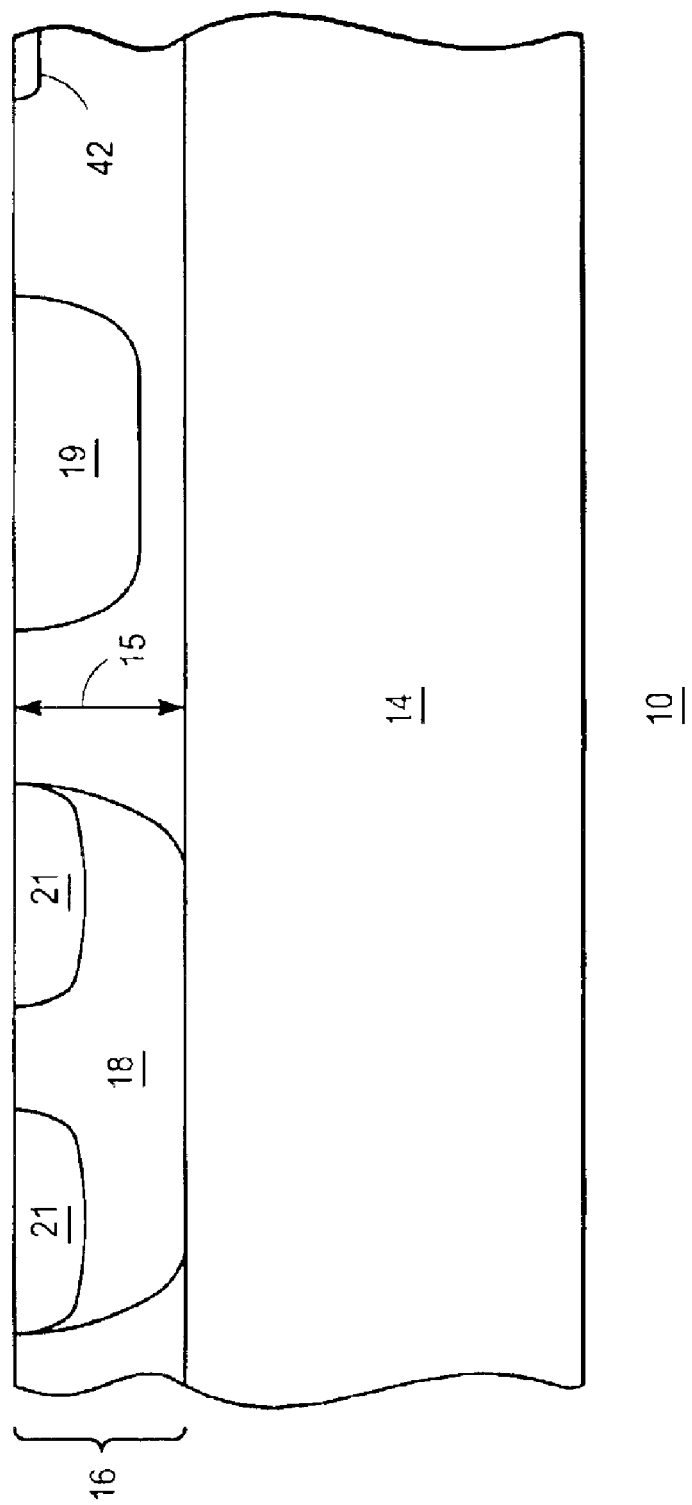
FIG. 3 schematically illustrates an embodiment of a portion of the semiconductor device of FIG. 1 at another stage of manufacturing in accordance with the present invention.
Figure 4:
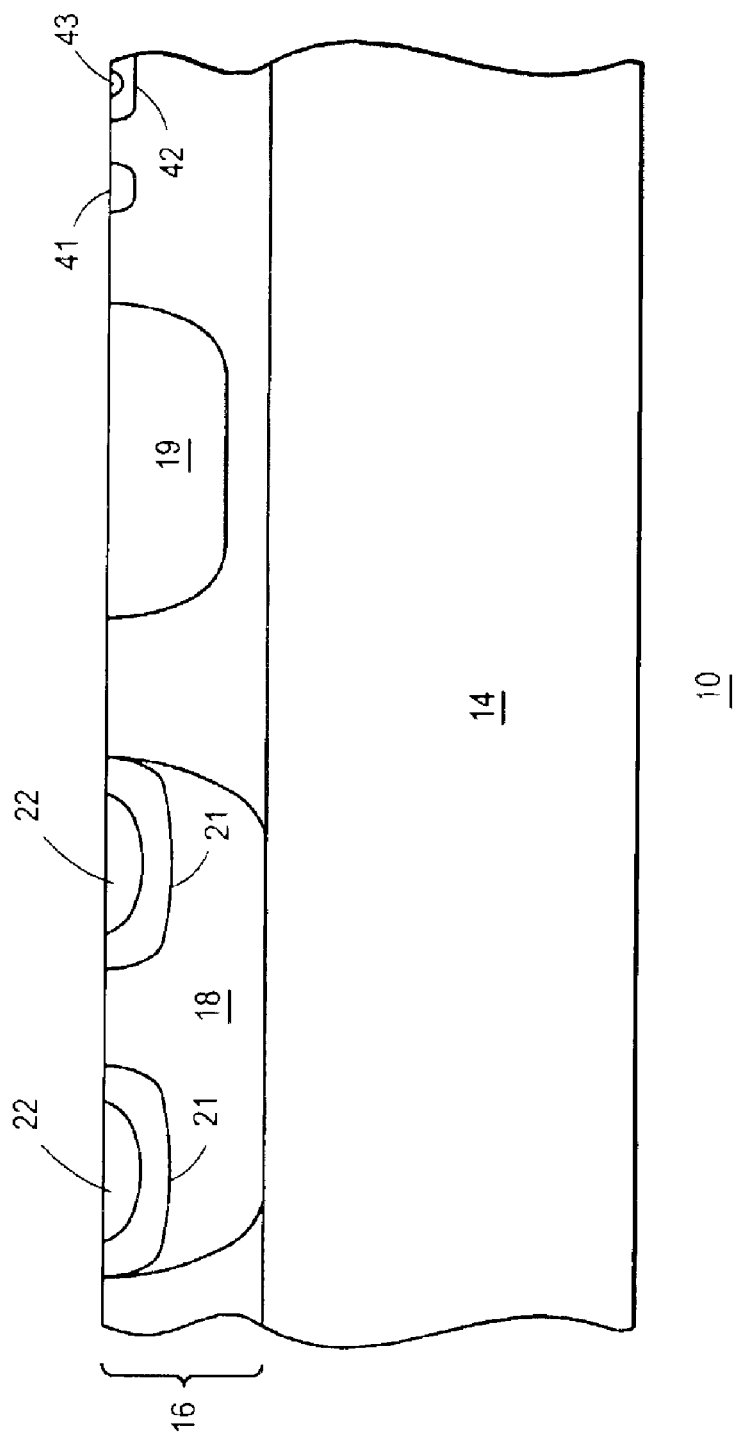
FIG. 4 schematically illustrates an embodiment of a portion of the semiconductor device of FIG. 1 at still another stage of manufacturing in accordance with the present invention.

FIG. 2 through FIG. 4 schematically illustrate an embodiment of a portion of device 10 at various stages of manufacturing. This explanation will have references to FIG. 1 through FIG. 4. A portion of layer 16 is doped to form first doped region or first well 18. Typically, well 18 is doped to have a resistivity that is no greater than approximately 0.3 ohm-centimeter and preferably is about 0.15 ohm-centimeter. Well 18 typically extends from the surface of layer 16 through layer 16 to electrically contact substrate 14. Well 18 preferably is formed by ion implantation of phosphorus but may be formed by other doping materials and doping techniques.

As shown by FIG. 3 after well 18 is formed, second doped region or second well 19 is formed in another portion of layer 16 juxtaposed to well 18. Well 19 is formed to have a doping type that is opposite to the doping type of substrate 14 and a resistivity that is less than the resistivity of well 18 but greater than the resistivity of substrate 14. Typically the resistivity of well 19 is about one thousand (1000) to three thousand (3000) ohms per square, and preferably is about two thousand (2000) ohms per square. Well 19 has a thickness or depth into layer 16 that is less than thickness 15 and typically does not electrically contact substrate 14. Also, high voltage drain region 42 of transistor 13 is formed in another portion of layer 16 where transistor 13 is to be formed. Additionally, plurality of third wells or drift regions 21 are formed in well 18. Well 19, regions 21, and region 42 are of the same conductivity type and could be formed at the same time thereby saving masking and implantation steps and the associated costs.

Referring to FIG. 4, fourth well or body region 22 is formed in each region 21. Preferably source region 41 and drain 43 of transistor 13 are formed at the same time as each region 22 in order to lower manufacturing costs since all have the same conductivity type. Regions 21, 41, and 43 are formed by ion implantation or other well known doping techniques.

Referring back to FIG. 1, subsequently, source regions 23 are formed in each region 21, and source region 31 and drain region 32 are formed in well 19 by well known techniques such as ion implantation. As is well know in the art, transistor 11 may include many regions 21 although only two are illustrated in FIG. 1 through FIG. 4 for simplicity of the illustration. Regions 21 that are adjacent to the edges of well 18 are positioned or formed to intersect the sides of well 18, as illustrated by dashed lines 25, to provide a stable breakdown voltage around the edges of well 18.

In view of all of the above, it is evident that a novel device and method is disclosed. Included, among other features, is forming a vertical power transistor in a well that has a low resistivity and high current capacity and is the same conductivity type as an epitaxial layer that has a thickness and resistivity that are optimized for forming lateral transistors. Doping a portion of the epitaxial layer to form the well facilitates forming the medium breakdown voltage vertical transistor on the same semiconductor die with numbers of lateral transistors and other types of electrical elements. The lateral transistors have a higher on-resistance than the power transistor and are formed in the same epitaxial layer.

While the invention is described with specific preferred embodiments, it is evident that many alternatives and variations will be apparent to those skilled in the semiconductor arts. More specifically the invention has been described for a particular N-channel vertical power transistor structure, although the method is directly applicable to other power devices such as IGBT's and P-channel MOSFETs.

What is claimed is:

1. A method of forming a vertical power transistor comprising:

providing a substrate of a first conductivity type having a first resistivity;

forming a layer of the first conductivity type on the substrate, the layer having a second resistivity that is greater than the first resistivity;

forming in the layer a first well having the first conductivity type including forming the first well having a third resistivity that is less than the second resistivity;

forming another well having a second conductivity type within the first well;

forming a second well having the second conductivity type in the layer and adjacent to the first well;

forming a vertical active device in the another well; and forming a lateral active device external to the another well.

2. The method of claim 1 wherein forming the lateral active device external to the another well includes forming the lateral active device in the second well.

3. The method of claim 1 wherein forming the lateral active device external to the another well includes forming the lateral active device in the layer.

4. The method of claim 1 wherein forming in the layer the first well having the first conductivity type including forming the first well having the third resistivity that is less than the second resistivity includes forming the first well to have a resistivity no greater than 0.3 ohm-cm.

5. The method of claim 4 wherein forming the layer of the first conductivity type on the substrate includes forming the layer to have a resistivity no greater than 0.8 ohm-cm.

6. The method of claim 1 wherein forming the layer of the first conductivity type on the substrate includes forming the layer to have a thickness no greater than about 5.0 microns.

7. The method of claim 1 wherein forming the layer of the first conductivity type on the substrate includes forming the layer to have a thickness between 4.0 and 5.0 microns.

8. The method of claim 1 wherein forming the another well having the second conductivity type within the first well includes forming a plurality of another wells within the first well.

9. The method of claim 1 wherein forming the another well having the second conductivity type within the first well includes positioning an edge of the another well to at least touch an edge of the first well.

10. The method of claim 1 wherein forming in the layer the first well having the first conductivity type includes forming at least a portion of the first well to extend through the layer and intersect the substrate.

11. The method of claim 1 wherein forming the second well having the second conductivity type in the layer and adjacent to the first well includes forming the second well to have a thickness that is less than a thickness of the layer.

12. The method of claim 1 wherein forming the layer of the first conductivity type on the substrate include forming an epitaxial layer on the substrate.

\* \* \* \* \*